United States Patent [19]

Tsujita

[11] Patent Number: 4,981,529
[45] Date of Patent: Jan. 1, 1991

[54] SEMICONDUCTOR SUBSTRATE PROVIDED WITH MARKS FOR ALIGNMENT EVEN UNDER A RESIST FILM

[75] Inventor: Kouichirou Tsujita, Hyogo, Japan

[73] Assignee: Mitsubishi Denki Kabushiki Kaisha, Tokyo, Japan

[21] Appl. No.: 399,399

[22] Filed: Aug. 28, 1989

Related U.S. Application Data

[63] Continuation of Ser. No. 156,434, Feb. 16, 1988, abandoned.

[30] Foreign Application Priority Data

Aug. 8, 1987 [JP] Japan .................... 62-198552

[51] Int. Cl.$^5$ ............................... H01L 21/47
[52] U.S. Cl. .................... 148/33; 437/226; 437/228; 437/229; 437/231; 437/924; 148/DIG. 102; 156/657
[58] Field of Search ............ 437/228, 225, 229, 231, 437/924, 226; 156/657; 148/DIG. 102, 33

[56] References Cited

U.S. PATENT DOCUMENTS 3,928,094 12/1975 Angell .................. 148/DIG. 102

FOREIGN PATENT DOCUMENTS 0233823 11/1985 Japan .................. 148/DIG. 102
0168933 7/1986 Japan .................... 437/924

Primary Examiner—Brian E. Hearn
Assistant Examiner—Tom Thomas
Attorney, Agent, or Firm—Lowe, Price, Leblanc, Becker & Shur

[57] ABSTRACT

A semiconductor substrate is provided with alignment marks for recognizing and deciding positions of registration of a wafer and a mask in a photolithographic step that is included in a process of manufacturing a semiconductor device. The alignment marks, X alignment marks and Y alignment marks in a preferred embodiment are arranged only on straight lines which are parallel to corresponding X and Y axes of a Cartesian Coordinate system for registration of the substrate the alignment marks which extend to avoid obstructions, such as steps defined along dicing lines that prevent flow of resist to be coated onto the semiconductor substrate.

2 Claims, 7 Drawing Sheets

FIG.9A PRIOR ART   FIG.9E PRIOR ART
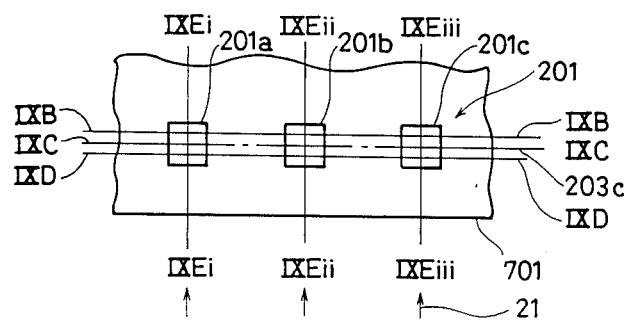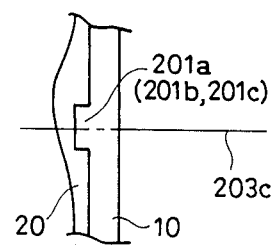
FIG.9B PRIOR ART
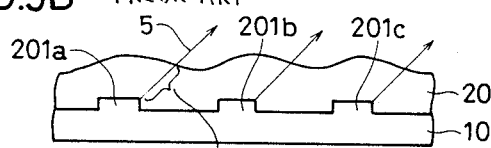
FIG.9C PRIOR ART
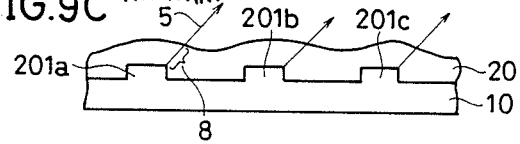
FIG.9D PRIOR ART
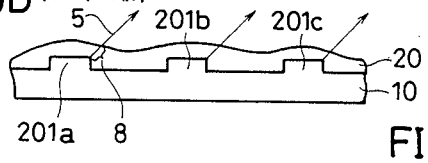
FIG.9F PRIOR ART
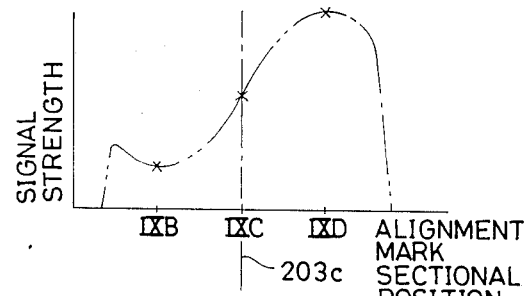
FIG.9G PRIOR ART
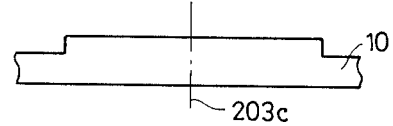

SEMICONDUCTOR SUBSTRATE PROVIDED WITH MARKS FOR ALIGNMENT EVEN UNDER A RESIST FILM

This application is a continuation of Application Ser. No. 07/156,434 filed Feb. 16, 1988 now abandoned.

BACKGROUND OF THE INVENTION

1. Field of the Invention

The present invention relates to a semiconductor substrate provided with alignment marks and, more particularly, it relates to an arrangement of alignment marks employed for registering a wafer and a mask in a photolithographic step included in the process of manufacturing a semiconductor device.

2. Description of the Prior Art

In order to accurately register patterns on a wafer and a mask in the aforementioned step through a reduction type projection/exposure apparatus, it is necessary to correctly recognize the positions of alignment marks provided for identifying prescribed positions on the wafer. In a conventional method of correctly recognizing the positions of alignment marks, light is applied to the alignment marks to utilize diffracted light received from the alignment marks. A description of the structure of such alignment marks with reference to the drawings follows.

FIG. 2 is a partially fragmented plan view showing an example of a semiconductor substrate provided with alignment marks. Referring to FIG. 2, an alignment mark group 1 projectingly provided on a wafer 10 serving as a semiconductor substrate comprises alignment marks 1a, 1b and 1c which are formed along central mark axes 3a, 3b and 3c respectively. These alignment marks 1a, 1b and 1c are illustrated as X alignment marks for deciding X-coordinates based on X-Y coordinate axes 2.

FIG. 3 is a partially fragmented sectional view taken along the line III—III in FIG. 2. Referring to FIG. 3, incident light is applied from above to the wafer 10 provided with the alignment mark group 1 in a direction shown by arrows 4. Within the light scattered from stepped portions of the respective alignment marks, only light that light is detected which satisfies a condition of diffraction that it is reflected in a given direction, i.e., only that diffracted light which is reflected in a direction shown by arrows 5. As shown in FIG. 2, detectors 50 for the diffracted light are so arranged as to detect the diffracted light in the direction of the arrows 5, received from, for example, the alignment mark 1a in a direction along the mark axis 3a, to form a system of measurement.

In actual mask registration, a resist film 20 is coated on the wafer 10 as obvious from a partially fragmented sectional view shown in FIG. 4. Therefore, the diffracted light in the direction of the arrows 5 is subjected to multiple reflection at the surface of the resist film 20 and the surface of the alignment mark group 1, and the intensity of light finally reflected from the resist film surface depends on light paths 8 defined in the resist film 20.

For example, FIGS. 5A, 5B and 5C show signal strength waveforms obtained by measuring diffracted light received from the alignment marks 1a, 1b and 1c of a three mark structure as shown in FIG. 2, representing the as intensity of light reflected from the surface of a resist film provided on the alignment marks. FIG. 5A shows signal slots for the case of a resist film of 10900 Å in thickness, FIG. 5B shows those for a film thickness of 10300 Å and FIG. 5C shows those for a film thickness of 10100 Å. These figures show positions of the mark axes 3a, 3b and 3c for the alignment marks 1a, 1b and 1c as shown in FIG. 2. Referring to FIGS. 5A to 5C, it is obvious that alignment mark sectional positions generating maximum reflected light vary with the resist film thickness on the mark positions since the resist film thickness is distributed on the alignment marks. It is also seen that the relationship between values of peak intensity corresponding to the axes of the respective alignment marks is changed with variation in resist film thickness. This is because of a standing wave phenomenon in which reflectance from the resist surface is changed in the form of a sine curve with variation in resist film thickness.

Thus, detection of diffracted light from alignment marks is finally performed by measurement of signal strength as intensity of reflected light. The signal strength thus obtained is illustrated as a curve showing peaks as indicated in FIG. 5A, whereby the positions of the alignment marks, i.e., the positions showing the central axes of the alignment marks can be recognized by determining the positions showing the respective peaks. Thus, the alignment marks are utilized as marks for position recognition on the wafer which is registered with a mask. In general, a useful set of marks is formed by alignment marks provided along a plurality of axes (three axes in FIG. 2), the results of position recognition of the central axes of the alignment marks are averaged to improve accuracy in mask alignment.

Japanese Patent Laying-Open Gazette No. 29138/1987 discloses a method of mark registration for forming two types of alignment marks by dividing a mark forming step into a plurality of steps and providing scanning lines respectively to perform alignment in order to improve accuracy in mask alignment and alignment marks employed therefor.

In general, alignment marks are arranged between dicing lines which are formed to divide/separate a wafer into respective semiconductor chips. For example, FIG. 6A is a plan view showing a wafer 10, FIG. 6B is a partially enlarged view showing a part A or B of the wafer 10 as shown in FIG. 6A and FIG. 6C is a partially fragmented sectional view taken along the line VIC—VIC in FIG. 6B.

Referring to FIG. 6A, the orientation of the wafer 10 is decided on the basis of an orientation flat 11.

Referring to FIG. 6B, the wafer 10 is divided into semiconductor chips 6 by dicing lines 7. Arranged between X dicing lines 701 are alignment mark groups 101 and 201 each formed by a set of alignment marks provided along three axes. Alignment mark groups 301 and 401 are similarly arranged between Y dicing lines 702. Each slender rectangle drawn by two-dot chain lines shows a set of a plurality of alignment marks provided along each mark central axis. X-coordinates and Y-coordinates are based on X-Y coordinate axes 2. The alignment mark groups 101 and 301 are formed by X alignment marks for deciding the X-coordinates, and the alignment mark groups 201 and 401 are formed by Y alignment marks for deciding the Y-coordinates. The X alignment mark groups and the Y alignment mark groups are randomly arranged as obvious from FIG. 6B.

Referring to FIG. 6C, the semiconductor chips 6 are provided on the wafer 10 with deposition layers 61 formed by pattern films, to define steps between the deposition layers 61 and the surface of the wafer 10 provided with the X alignment mark group 101 between the X dicing lines 701.

When a resist is rotatingly coated on the central surface of the wafer 10 as shown in FIG. 6A, the resist flows radially outward on the wafer 10 in directions shown by arrows 21. At this time, the steps as shown in FIG. 6C, being defined on the dicing lines 701 and 702, serve as obstructions against such flow of the resist. If, for example, the dicing lines as shown in FIG. 6B are formed in the part A of FIG. 6A, the flow of the resist is prevented by the X dicing lines 701. Further, the flow of the resist is prevented by the Y dicing lines 702 in the part B of FIG. 6A. When the flow of the resist is thus prevented, covering by the resist tends to be nonuniform in thickness. Thus, the thickness of the resist film formed on the alignment marks located between the dicing lines varies with the direction of the resist flow thereat.

The influence exerted by such distribution of the resist film thickness on the alignment marks on the intensity of reflected light, with reference to the X alignment mark group 101 and the Y alignment mark group 201 as shown in FIG. 6B, will now be described. It is assumed that the part shown in FIG. 6B is present in the position A of FIG. 6A. In this case, the flow of the resist is prevented by the X dicing lines 701, whereby the resist film formed on the alignment marks is changed in thickness by the direction of the flow. Consequently, the resist film thickness is distributed on the alignment marks provided along each alignment mark central axis 103a, 103b, 103c in the X alignment mark group 101, and the thickness is in the same distribution between the respective mark central axes. Therefore, signal strength levels from the alignment marks provided along the respective central axes are identical to each other, as shown in FIG. 7A. In this case, the distribution in thickness of the resist film on the alignment marks, which is parallel to the mark central axes, merely decides the intensity of the reflected light but changes no positions showing peaks of the reflected light, hence no influence is exerted on the accuracy in alignment of the wafer.

On the other hand, still in part A of wafer 10, per FIG. 6A the thickness of the resist film on the alignment marks is varied with the mark central axes in the Y alignment mark group 201. Therefore, signal strength levels obtained from the alignment marks are different for the alignment mark central axes 203a, 203b and 203c as shown in FIG. 7B. In this case, there is no benefit in keeping all of peak intensity levels within a given range in signal processing, as best seen in FIG. 7C, and hence peaks from some alignment marks may be overranged or decreased to reduce successfulness in mask alignment. Further, covering by the resist film is not symmetrical about the central axis of any individual alignment mark of group 201, and hence an offset is caused in recognition of the mark positions. As the result, the accuracy of mask alignment is reduced.

Consideration of the aforementioned phenomenon is provided hereinbelow with reference to a typical example of the relationship between variations in covering by the resist film of the alignment marks and the corresponding of measured signal strength. 0 FIGS. 8A to 8G are diagrams illustrating a typical example of the relationship between covering by a resist film and the corresponding waveform of detected signal strength for a case involving resist flow in parallel with alignment mark central axes.

FIG. 8A is a partially fragmented plan view showing an exemplary X alignment mark group which is provided along the mark central axis 103a (as best seen in FIG. 6B) and is formed of three alignment marks 101a, 101b and 101c. It is assumed now that resist flows in a direction shown by an arrow 21 while being prevented by an X dicing line 701 serving as an obstruction, thereby to form a resist film on the alignment marks.

FIG. 8B is a sectional view taken along lines VIIIBi—VIIIBi, VIIIBii—VIIIBii and VIIIBiii—VIIIBiii, which are parallel to the mark central axis 103a as shown in FIG. 8A. Sections along the respective lines are in the same configuration and are covered by resist in an identical manner although the same are assymmetrical with respect to the centers of the respective marks.

FIGS. 8C, 8D and 8E are sectional views of FIG. 8A taken along lines VIIIC—VIIIC, VIIID—VIIID and VIIIE—VIIIE, which are perpendicular to the direction of the arrow 21 showing the flow of the resist. While these sections are symmetrical in configuration about the mark central axis 103a, the resist film thickness is different in the respective mark sections.

FIGS. 8F and 8G show the waveform of the signal strength obtained from such alignment marks and the mark section respectively. With respect to the signal strength waveform, the resist film thickness is identical in the sections VIIIBi—VIIIBi, VIIIBii—VIIIBii and VIIIBiii—VIIIBiii so that the optical paths 8 of the diffracted light as shown by arrows 5 are equal to each other, as is illustrated in FIG. 8B, and hence signal strength levels by the diffracted light along the mark central axis are constant in all of the mark sectional positions and are seen to be in trapezoidal form. Therefore, the central position of mark recognition is located in a position shown by the line VIIIBii—VIIIBii by averaging, whereby the mark central axis 103a is correctly recognized.

FIGS. 9A to 9G are diagrams for illustrating a typical example of the relationship between covering by resist and the waveform of signal strength in a case where the resist flows perpendicularly to an alignment mark central axis.

FIG. 9A is a partially fragmented plan view illustrating an example wherein a Y alignment mark group provided along the mark central axis 203c in FIG. 6B is formed of three marks 201a, 201b and 201c. It is assumed now that the resist flows in the direction shown by an arrow 21 while being prevented by an X dicing line 701 serving as an obstruction, thereby to form a resist film on the marks.

FIGS. 9B, 9C and 9D respectively show sectional views taken along lines IXB—IXB, IXC—IXC and IXD—IXD which are parallel to the mark central axis 203c. While the sections taken along the respective lines are symmetrical in configuration about the centers of the respective marks, the resist film thickness is different in the respective sections.

On the other hand, FIG. 9E shows a sectional view taken along lines IXEi—IXEi, IXEii—IXEii and IXEiii—IXEiii which are parallel to the direction of the arrow 21 in which the resist flows. Now, the respective mark sections are in the same configuration and they are covered in an identical manner, although the resist coverage is same are assymmetrical with respect to the mark central axis 203c.

FIGS. 9F and 9G show the signal strength waveform obtained from such alignment marks and the mark section, respectively. In the signal strength waveform with the aforementioned standing wave phenomenon, the minimum reflection factor is shown by the resist film thickness in the section IXB—IXB and the maximum reflection factor is shown by the resist film thickness in the section IXD—IXD while an intermediate reflection factor is shown by the resist film thickness in the section IXC—IXC. In this case, the central position of mark recognition is located along the line IXD—IXD, and this will cause erroneous recognition of the position of mark central axis 203c.

Since the conventional alignment marks are randomly arranged as hereinabove described, the flow of the resist to be coated thereon may be interrupted by obstructions provided around the alignment marks to prevent uniform covering of the marks by the resist film provided thereon. Thus, the mark positions may be erroneously recognized. Consequently, accuracy in mask alignment may be adversely affected.

SUMMARY OF THE INVENTION

The present invention has been proposed to overcome the aforementioned disadvantages, and an object thereof is to obtain a semiconductor substrate provided with alignment marks which can eliminate erroneous recognition of mark positions and improve successfulness and accuracy of mask alignment.

The semiconductor substrate provided with alignment marks according to the present invention is a semiconductor substrate provided with alignment marks for recognizing and deciding positions of registration of a wafer and a mask in a photolithographic step included in the process of manufacturing a semiconductor device. The alignment marks are arranged on straight lines, which are parallel to axes of coordinates of the positions of registration decided by the alignment marks and extend to avoid obstructions preventing flow of resist that is to be coated onto the semiconductor substrate.

According to the present invention, only those alignment marks required for recognizing/deciding coordinates of positions of registration along a particular coordinate axis are arranged on straight lines to normal to that particular axis of a set of axes of the coordinates recognized/decided by the marks, and extend to avoid obstructions preventing flow of resist. Therefore, covering by the resist on the marks is not influenced by the presence of such obstructions, but becomes uniform with respect to the alignment mark axes. Thus, the peak intensity levels of diffracted light obtained by the alignment marks are constant, so that the successfulness and accuracy of mask alignment can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9A, 9B, 9C, 9D, 9E, 9F and 9G are diagrams for illustrating relationship between covering by resist and the waveform of signal strength in a case in which the resist flows normal to an alignment mark central axis.

DESCRIPTION OF THE PREFERRED EMBODIMENT

An embodiment of the present invention is now described with reference to the drawings.

Figure 1:
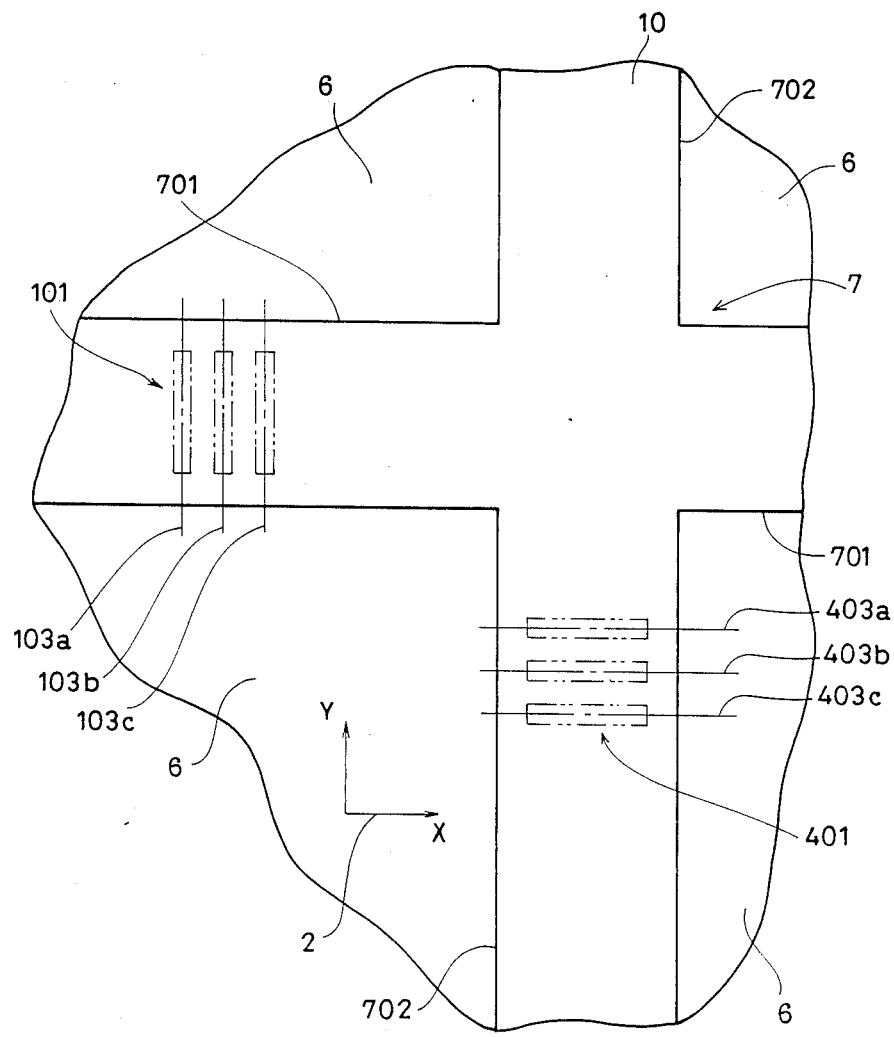
FIG. 1 is a partially fragmented plan view showing a semiconductor substrate on which alignment marks according to an embodiment of the present invention are arranged/provided.
Figure 2:
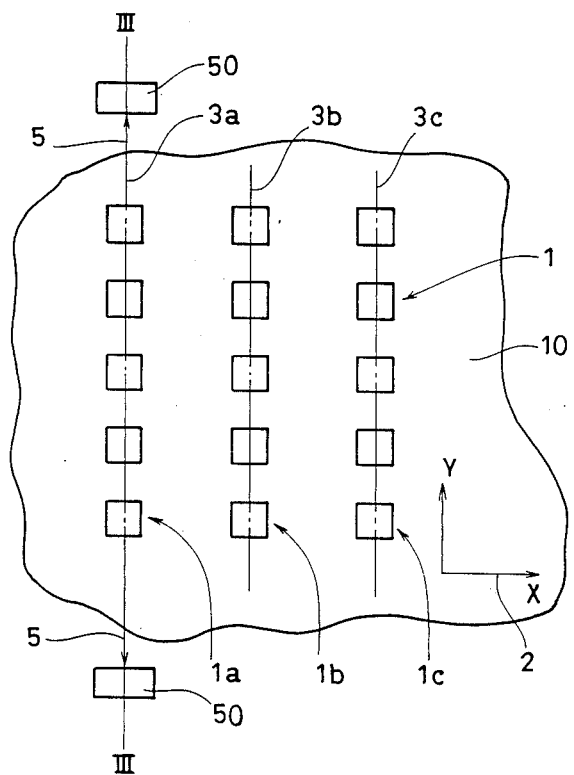
FIG. 2 is a partially fragmented plan view showing an example of a semiconductor substrate provided with conventional alignment marks.
Figure 3:
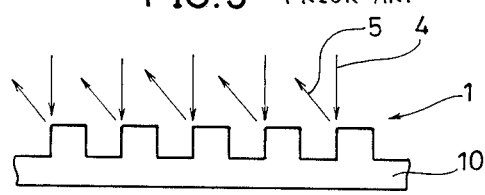
FIG. 3 is a partially fragmented sectional view taken along the line III—III in FIG. 2.
Figure 4:
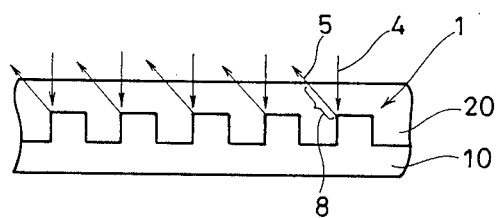
FIG. 4 is a partially fragmented sectional view taken along the line III—III in FIG. 2, showing a case in which resist is coated onto the semiconductor substrate.
Figure 5A:
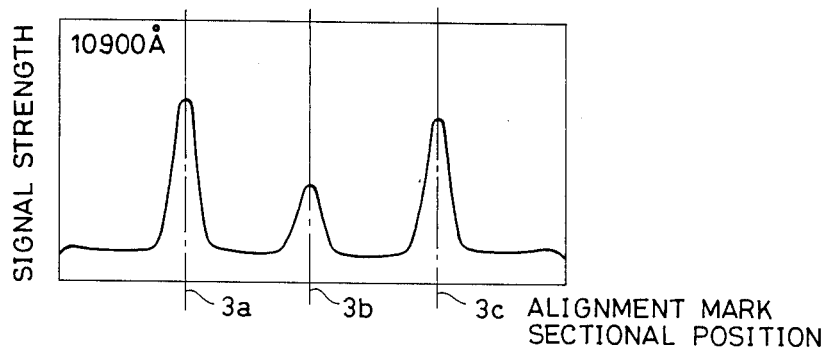
FIGS. 5A, 5B and 5C illustrate examples of signal strength waveforms obtained from alignment marks.
Figure 5B:
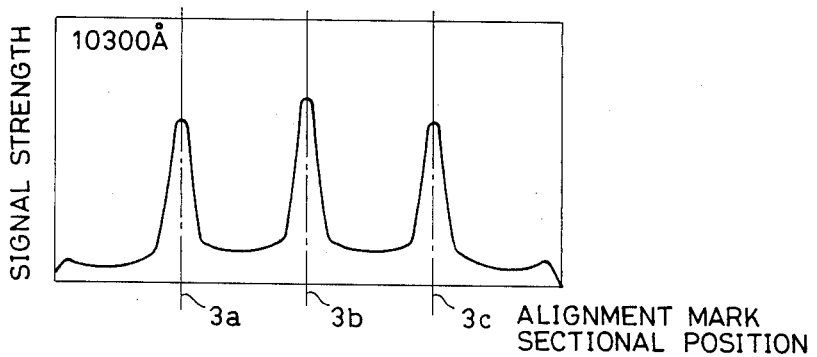
Figure 5C:
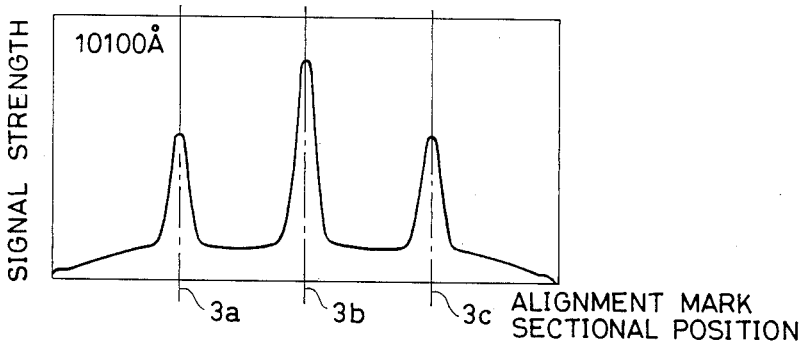
Figure 6A:
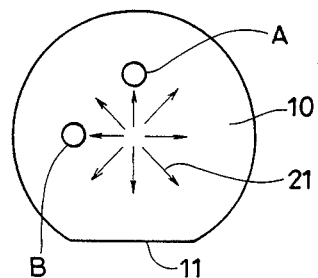
FIGS. 6A, 6B and 6C illustrate an example of a semiconductor substrate provided with conventional alignment marks which are arranged between dicing lines on a wafer.
Figure 6C:
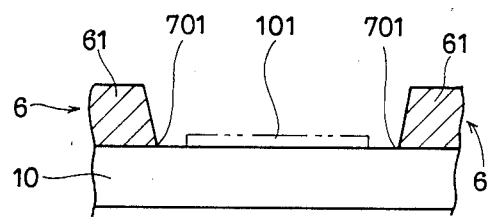
Figure 6B:
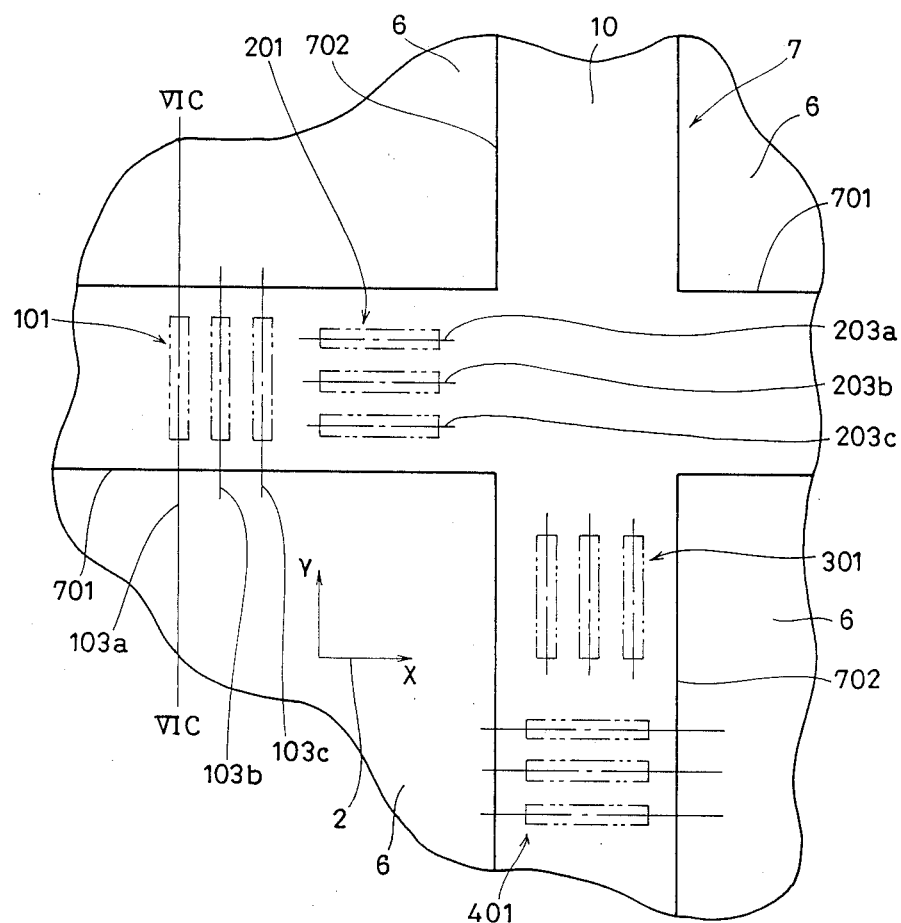

FIG. 1 shows a semiconductor substrate provided with alignment marks according to the present invention, as a partially fragmented plan view showing the part A or B of a wafer 10 of the type illustrated schematically in FIG. 6A. Referring to FIG. 1, the wafer 10 is divided into semiconductor chips 6 by dicing lines 7. An X alignment mark group 101 is arranged between X dicing lines 701 and a Y alignment mark group 401 is arranged between Y dicing lines 702. The X alignment mark group 101 is provided along respective mark central axes 103a, 103b and 103c, and the Y alignment mark group 401 is provided along respective mark central axes 403a, 403b and 403c. Only an X alignment mark group is thus arranged between the X dicing lines and only a Y alignment mark group is arranged between the Y dicing lines, whereby no obstruction preventing flow of resist to be coated is present in the direction of the X-coordinate axis with respect to the X alignment mark group and in the direction of the Y-coordinate axis with respect to the Y alignment mark group.

With reference to the X alignment mark group 101 arranged between the X dicing lines 701, the influence of the flow of resist to be coated thereon is considered below. While the flow of the resist on the marks varies with the locations of the alignment marks on the wafer, the following description relates to a typical examples wherein the resist flows in directions perpendicular and parallel to the dicing lines. Other situations, in which, the resist flows in a direction other than these directions can be then understood.

When the resist flows in a direction perpendicular to the X dicing lines 701, such a flow of the resist is prevented by the steps of the X dicing lines 701, whereby the resist film thickness is changed on the respective alignment marks provided along the mark central axes 103a, 103b and 103c, while covering by the resist is identical between the respective mark central axes. Therefore, signal strength levels obtained from the respective marks should be equal to each other. Such a distribution of the resist film thickness, being parallel to the mark central axes, exerts no influence on the accuracy in mask alignment from use of this marks, as was described hereinabove with reference to particular disadvantages found in the prior art.

As for the case in which the resist flows in a direction parallel to the X dicing lines 701, no step is defined in the X-coordinate axis direction of the X alignment mark group 101, whereby of the marks by the resist is uniform and the resist film thickness is on the respective marks are equal to each other. Thus, signal strength levels obtained from the respective marks also are equal to each other. The resist is uniformly distributed on the respective marks, and the resist film thickness is in the same distribution between the mark central axes.

Also, in the case where the Y alignment mark group 401 is arranged between the Y dicing lines 702, covering by the resist is uniform with respect to the resist flow, and the respective signal strength levels obtained by the same are constant.

Figure 7A:
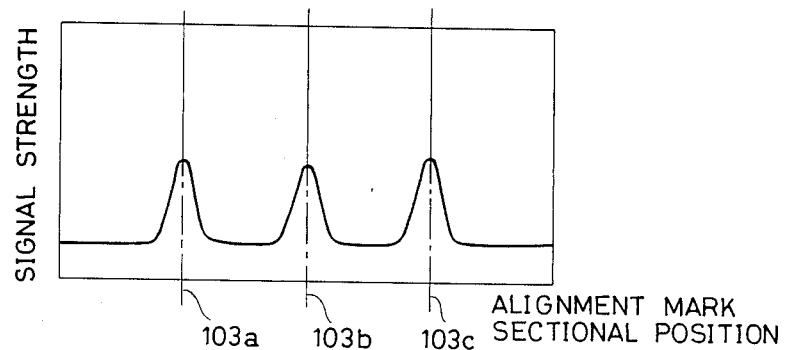
FIGS. 7A, 7B and 7C illustrate signal strength waveforms obtained from the alignment marks shown in FIG. 6B.
Figure 7B:
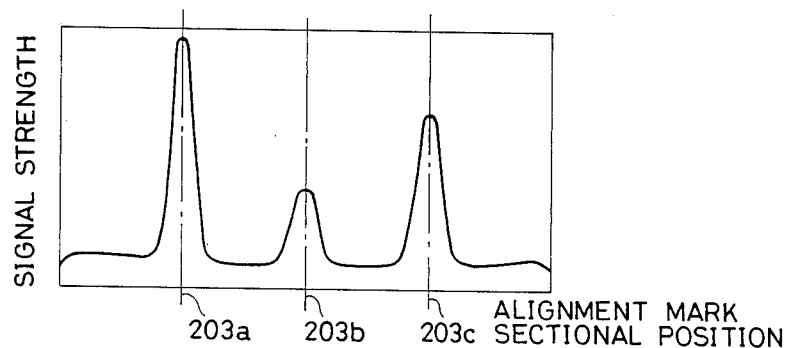
Figure 7C:
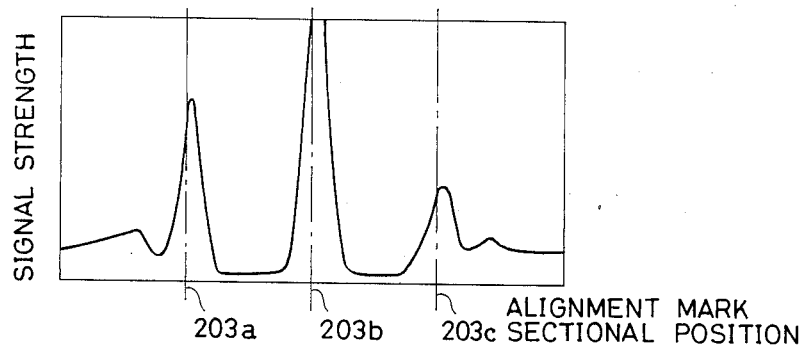

When the alignment marks are thus arranged, signals obtained from the marks have regular peak intensity levels just as was illustrated in FIG. 7A with respect to all points on the wafer including the X alignment mark group and the Y alignment mark group. Convenience is use and accuracy of mask alignment by these alignment marks are, therefore, improved.

Figure 8A:
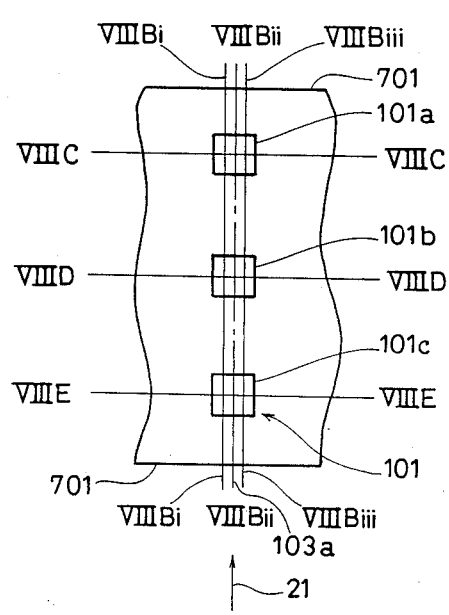
FIGS. 8A, 8B, 8C, 8D, 8E, 8F and 8G are diagrams for illustrating relationships between covering by resist and the waveform of signal strength in a case in which the resist flows in parallel with an alignment mark central axis.
Figure 8B:
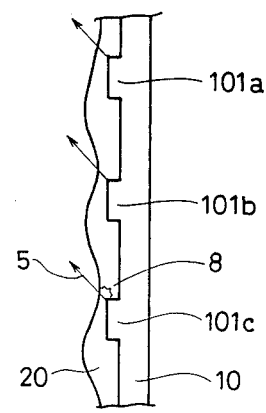
Figure 8C:
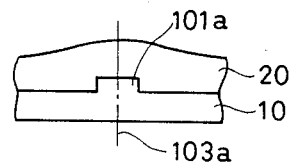
Figure 8F:
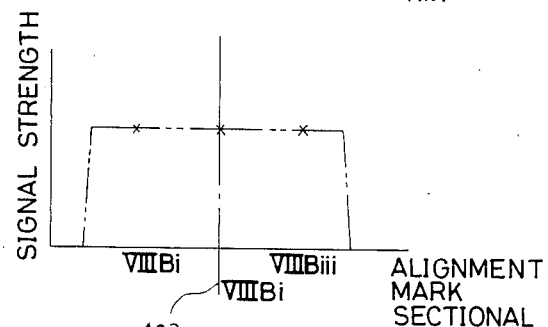
Figure 8D:
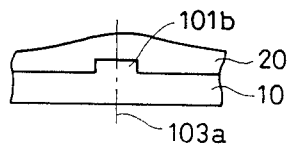
Figure 8E:
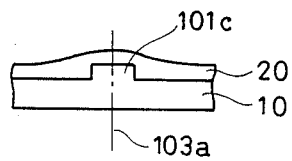
Figure 8G:
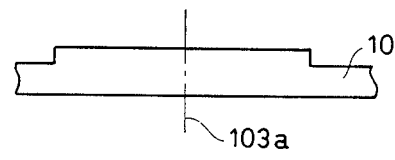

Furthermore, the resist smoothly flows in the direction perpendicular to the mark central axes (direction parallel to the dicing lines) with no interruption. Therefore, covering by the resist is symmetrical about the mark central axes just as was illustrated in FIGS. 8C, 8D and 8E, whereby no offset is caused in recognition of mark positions.

Although the steps defined along the dicing lines are described as examples of the obstructions in this embodiment, such obstructions may be steps defined by films deposited for any reason on the semiconductor substrate, while such obstructions may be anything that is preventing the flow of the resist in general.

In summary, this embodiment is characterized in that no sharp steps are arranged by pattern formation on the respective semiconductor chips or the like in horizontal positions around the X alignment marks or vertical positions around the Y alignment marks. The definition of "vertical" is understood by first placing the orientation flat of the wafer downward as viewed, and with respect to symbols X and Y, the term "horizontal direction" indicates the direction of the X-coordinate axis and the term "vertical direction" indicates the direction of the Y-coordinate axis in terms of directions referring to the same wafer.

Although this embodiment is directed to X alignment marks and Y alignment marks for deciding X-coordinates and Y-coordinates on the basis of X-Y coordinate axes, the coordinate axes may be arbitrarily set so far as the same are adapted to decide coordinates of positions of registration, and the alignment marks may be formed in correspondence thereto.

According to the present invention as hereinabove described, arrangement of the alignment marks is optimized with respect to the obstructions preventing flow of the resist to make as uniform as possible the resist film thickness on the alignment marks, thereby to improve both the convenience and the accuracy of mask alignment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor substrate, comprising: chips having sides selectively disposed on said surface of said substrate so as to prevent a flow, along dicing lines formed on the substrate, of a resist material to be coated on the substrate; and geometrically similar straight alignment marks provided on a surface of the substrate, for recognizing and deciding a position of registration of a wafer formed thereon and a mask used therewith in a photolithographic step included in the process of manufacturing a semiconductor device on the substrate, groups of said alignment marks being formed and distributed only along straight lines with the alignment marks in each group being evenly spaced apart, lengthwise mutually parallel, and aligned normal to a corresponding axis of a set of X-Y Cartesian coordinate axes, for determination of said positions of registration with respect to said corresponding axes being decided by said alignment marks, said alignment marks each extending so as to avoid said sides, wherein said chips are defined along dicing lines formed for dividing/separating the semiconductor substrate and are in the form of steps formed by selectively depositing a film on the semiconductor substrate, the dicing lines are provided along the respective directions of the coordinate axes, said alignment marks comprise a group of X alignment marks distributed only along the X-axis and each normal thereto for deciding X-coordinates of said positions of registration and a group of Y alignment marks distributed only along the Y-axis and each normal thereto for deciding Y-coordinates of said positions of registration, and said X alignment marks are arranged only between X dicing lines provided along the direction of the X-coordinate axis and said Y alignment marks are arranged only between Y dicing lines provided along the direction of the Y-coordinate axis.

2. A semiconductor substrate provided with alignment marks in accordance with 1, wherein:

said substrate is formed with a flat normal to said surface of said substrate, and one of said X and Y axes is oriented to be parallel to said flat.

* * * * *

UNITED STATES PATENT AND TRADEMARK OFFICE
CERTIFICATE OF CORRECTION

PATENT NO.   :   4,981,529

DATED        :   January 1, 1991

INVENTOR(S)  :   Kouichirou TSUJITA

It is certified that error appears in the above-identified patent and that said Letters Patent is hereby corrected as shown below:

On the title page, item [54], and in column 1, lines 1-3 the title should read as follows:
SEMICONDUCTOR SUBSTRATE PROVIDED WITH MARKS FOR PRECISE ALIGNMENT EVEN UNDER A RESIST FILM Signed and Sealed this Fourteenth Day of July, 1992

*Attest:*

DOUGLAS B. COMER

*Attesting Officer*   Acting Commissioner of Patents and Trademarks